United States Patent
Golmohammadizangabad et al.

(10) Patent No.: US 11,143,789 B2
(45) Date of Patent: Oct. 12, 2021

(54) STATIC ENGINE AND NEURAL NETWORK FOR A COGNITIVE RESERVOIR SYSTEM

(71) Applicant: Beyond Limits, Inc., Glendale, CA (US)

(72) Inventors: Azarang Golmohammadizangabad, Los Angeles, CA (US); Shahram Farhadi Nia, Glendale, CA (US)

(73) Assignee: Beyond Limits, Inc., Glendale, CA (US)

( * ) Notice: Subject to any disclaimer, the term of this patent is extended or adjusted under 35 U.S.C. 154(b) by 375 days.

(21) Appl. No.: 16/157,732

(22) Filed: Oct. 11, 2018

(65) Prior Publication Data

US 2019/0107643 A1 Apr. 11, 2019

Related U.S. Application Data

(60) Provisional application No. 62/571,150, filed on Oct. 11, 2017.

(51) Int. Cl.
*G01V 99/00* (2009.01)
*G06N 3/08* (2006.01)
(Continued)

(52) U.S. Cl.
CPC ............ *G01V 99/005* (2013.01); *G06F 30/20* (2020.01); *G06N 3/04* (2013.01); *G06N 3/0436* (2013.01);
(Continued)

(58) Field of Classification Search
CPC ....... G01V 99/005; G06F 30/20; G06F 30/25; G06F 30/27; G06F 30/28; G06F 2111/00;
(Continued)

(56) References Cited

U.S. PATENT DOCUMENTS

2004/0133531 A1 7/2004 Chen et al.
2006/0285436 A1 12/2006 Mayorga et al.
(Continued)

FOREIGN PATENT DOCUMENTS

WO WO 2016/140645 9/2016
WO WO 2017/079178 5/2017
(Continued)

OTHER PUBLICATIONS

Application No. PCT/US2018/055471 International Preliminary Report on Patentability dated Apr. 14, 2020.
(Continued)

*Primary Examiner* — Rehana Perveen
*Assistant Examiner* — Steven W Crabb
(74) *Attorney, Agent, or Firm* — Polsinelli LLP (57) ABSTRACT

Implementations described and claimed herein provide systems and methods for developing a reservoir. In one implementation, observed data points in a volume along a well trajectory and well logs corresponding to observed data points are received at a neural network. Feature vectors are generated using the neural network. The feature vectors are defined based on a distance between each of the observed data points and randomly generated points in the volume. A 3D populated log is generated by propagating well log values of the feature vectors across the volume. Uncertainty is quantified by generating a plurality of realizations including the 3D populated log. Each of the realizations is different and equally probable. core values are generated from the realizations, and a static model of the reservoir is generated by clustering the volume into one or more clusters of rock types based on the core values.

20 Claims, 8 Drawing Sheets (51) Int. Cl.
*G06N 3/04* (2006.01)
*G06F 30/20* (2020.01)

(52) U.S. Cl.
CPC ............. *G06N 3/0454* (2013.01); *G06N 3/08* (2013.01); *G06N 3/088* (2013.01)

(58) Field of Classification Search
CPC .. G06F 2119/22; G06N 3/088; G06N 3/0436; G06N 3/0454; G06N 3/08; G06N 3/04
See application file for complete search history.

(56) References Cited

U.S. PATENT DOCUMENTS

| | | | |
|---|---|---|---|
| 2009/0020284 A1* | 1/2009 | Graf | E21B 44/00 166/250.15 |
| 2009/0119018 A1* | 5/2009 | Priezzhev | G01V 1/301 702/11 |
| 2010/0235154 A1 | 9/2010 | Meurer et al. | |
| 2011/0002194 A1 | 1/2011 | Imhof et al. | |
| 2012/0203525 A1 | 8/2012 | Rodrigeuz Herrera et al. | |
| 2012/0221306 A1* | 8/2012 | Hurley | G01V 99/005 703/6 |
| 2013/0124171 A1 | 5/2013 | Schuette et al. | |
| 2015/0066460 A1 | 3/2015 | Klinger et al. | |
| 2015/0300151 A1 | 10/2015 | Mohaghegh | |
| 2015/0347898 A1 | 12/2015 | Hiu et al. | |
| 2016/0078345 A1 | 3/2016 | Rajati et al. | |
| 2017/0336811 A1 | 11/2017 | Stone et al. | |
| 2018/0188403 A1 | 7/2018 | Halsey et al. | |
| 2018/0321421 A1* | 11/2018 | Halabe | G01V 1/30 |
| 2019/0107642 A1 | 4/2019 | Nia | |
| 2019/0107644 A1 | 4/2019 | Nia | |
| 2019/0107645 A1 | 4/2019 | Nolan | |

FOREIGN PATENT DOCUMENTS

| WO | WO 2019/075242 | 4/2019 |
|---|---|---|
| WO | WO 2019/075245 | 4/2019 |
| WO | WO 2019/075247 | 4/2019 |
| WO | WO 2019/075250 | 4/2019 |

OTHER PUBLICATIONS

Application No. PCT/US2018/055475 International Preliminary Report on Patentability dated Apr. 14, 2020.
Application No. PCT/US2018/055477 International Preliminary Report on Patentability dated Apr. 14, 2020.
Application No. PCT/US2018/055480 International Preliminary Report on Patentability dated Apr. 14, 2020.
PCT Application No. PCT/US2018/055471 International Search Report and Written Opinion dated Jan. 7, 2019.
PCT Application No. PCT/US2018/055477 International Search Report and Written Opinion dated Jan. 7, 2019.
PCT Application No. PCT/US2018/055480 International Search Report and Written Opinion dated Dec. 31, 2018.
U.S. Appl. No. 16/157,716, Shahram F. Nia, System for Improved Reservoir Exploration and Production, filed Oct. 11, 2018.
PCT/US18/55471, System for Improved Reservoir Exploration and Production, Oct. 11, 2018.
PCT/US18/55475, Static Engine and Neural Network for a Cognitive Reservoir System, Oct. 11, 2018.
U.S. Appl. No. 16/157,757, Shahram F. Nia, Dynamic Engine for a Cognitive Reservoir System, filed Oct. 11, 2018.
PCT/US18/55477, Dynamic Engine for a Cognitive Reservoir System, Oct. 11, 2018.
U.S. Appl. No. 16/157,764, Zackary H. Nolan, Recommendation Engine for a Cognitive Reservoir System, filed Oct. 11, 2018.
PCT/US18/55480, Recommendation Engine for a Cognitive Reservoir System, Oct. 11, 2018.
PCT Application No. PCT/US2018/055475 International Search Report and Written Opinion dated Feb. 15, 2019.
U.S. Appl. No. 16/157,716 Office Action dated Jul. 14, 2021.
U.S. Appl. No. 16/157,764 Office Action dated Aug. 25, 2021.

* cited by examiner

FIG. 8

STATIC ENGINE AND NEURAL NETWORK FOR A COGNITIVE RESERVOIR SYSTEM

CROSS-REFERENCE TO RELATED APPLICATIONS

The present application claims benefit under 35 U.S.C. § 119 to U.S. Provisional Patent Application No. 62/571,150, entitled "Techniques for Improved Reservoir Exploration and Production" and filed Oct. 11, 2017, which is specifically incorporated by reference in its entirety herein.

TECHNICAL FIELD

Aspects of the present disclosure relate to exploration, evaluation, and production of a reservoir, and more particularly to systems and methods for static modeling of the reservoir using data driven techniques including supervised methods, such as a neural network and k-nearest neighbor regression, and unsupervised algorithms, such as k-means clustering.

BACKGROUND

A reservoir is subsurface porous pool of a natural resource, such as oil and/or gas, contained within rock formations, which have varying levels of porosity and permeability. The porosity is dictated by a volume of the natural resource and the pore volume of the rock, while the permeability relates to the ability of the rock to allow the natural resource to flow through for collection. Reservoirs are identified using hydrocarbon exploration techniques that involve drilling along a well trajectory. Well logs are a concise, detailed plot of formation parameters versus depth that are captured using logging tools deployed along the well trajectory. Using the well logs, professionals may identify lithologies, differentiate between porous and nonporous rock, and identify payzones in the subsurface rock formations where the natural resource exists in exploitable quantities.

However, while characteristics of the petrophysical phenomena, including porosity and permeability, along the well trajectory may be known, uncertainty of the petrophysics of the subformation increases as distance away from the well trajectory increases. Accordingly, reservoir modeling is utilized to estimate the petraphysics for use in decision making regarding field development, future production prediction, well placement, and other reservoir production activities. Conventionally, a suite of professionals are involved in gathering the data, generating the models, and employing the models in decision making. Each of these professionals is typically utilizing a discrete tool that outputs results dictated by underlying assumptions by the professional and handing off the results to another professional to use in the next step. As such, the end to end process is conventionally plagued with human error and bias in the results generated by each tool with no retention of the disparate professional opinions that were presented during the discrete processes but rejected. In addition to human error and bias influencing the results, conventional systems and methods have inconsistent workflows and inefficient handoffs and fail to integrate the discrete tools with disparate programming languages and to retain alternative opinions, assumptions, and underlying data. Overall, conventional systems and methods fail to meaningfully quantify uncertainty and risk in reservoir exploration, evaluation, development, and production.

It is with these observations in mind, among others, that various aspects of the present disclosure were conceived and developed.

SUMMARY

Implementations described and claimed herein address the foregoing problems by providing systems and methods for developing a reservoir. In one implementation, static data is received at a neural network. The static data includes a set of observed data points in a reservoir volume along a well trajectory and well logs corresponding to the set of observed data points. A set of feature vectors is generated to feed the neural network. The set of feature vectors is defined based on a distance between each of the observed data points and a set of randomly selected points in the reservoir volume. A three-dimensional populated log is generated using the neural network by propagating well log values of the set of feature vectors across the reservoir volume. Uncertainty is quantified using the neural network by generating a plurality of realizations including the three-dimensional populated log. Each of the plurality of realizations is different and equally probable. The plurality of realizations corresponding to each static log data are generated using neural networks, and a low dimensional model of the reservoir is generated by clustering the sub-regions of the reservoir volume into one or more rock types.

Other implementations are also described and recited herein. Further, while multiple implementations are disclosed, still other implementations of the presently disclosed technology will become apparent to those skilled in the art from the following detailed description, which shows and describes illustrative implementations of the presently disclosed technology. As will be realized, the presently disclosed technology is capable of modifications in various aspects, all without departing from the spirit and scope of the presently disclosed technology. Accordingly, the drawings and detailed description are to be regarded as illustrative in nature and not limiting.

DETAILED DESCRIPTION

Aspects of the present disclosure involve systems and methods for the characterization and exploitation of a reservoir using artificial intelligence techniques. Generally, a reservoir development system is an end to end automated system permitting local expertise to be injected into a series of modular processes with a handoff between the modular processes conducted through a common integration platform. The reservoir development system thus provides an integration platform for numerous data-driven, physics-based, expertise and policy elements to determine where to drill in the reservoir with a justification for which the underlying reasoning may be traced. To arrive at the decision of where to drill, the reservoir development system generates a static model comprising a geological representation of the reservoir. The reservoir development system quantifies uncertainty in the static model and considers risk in the reasoning. From the static model, the reservoir development system generates a dynamic model of the reservoir, which analyzes the aspects of the reservoir that change over time through a graph representation. Using the dynamic model, the reservoir development system provides a ranking of target volumes for drilling with supporting information in relative and absolute terms detailing how the ranking was produced. If any of the underlying information changes, the reservoir development system may provide real time reranking. Overall, the reservoir development system reduces human bias and error, provides a consistent workflow, facilitates handoffs, retains alternative opinions and supporting information, addresses uncertainty, and accommodates changes to the supporting information. These benefits, among others, will be apparent from the present disclosure.

Figure 1:
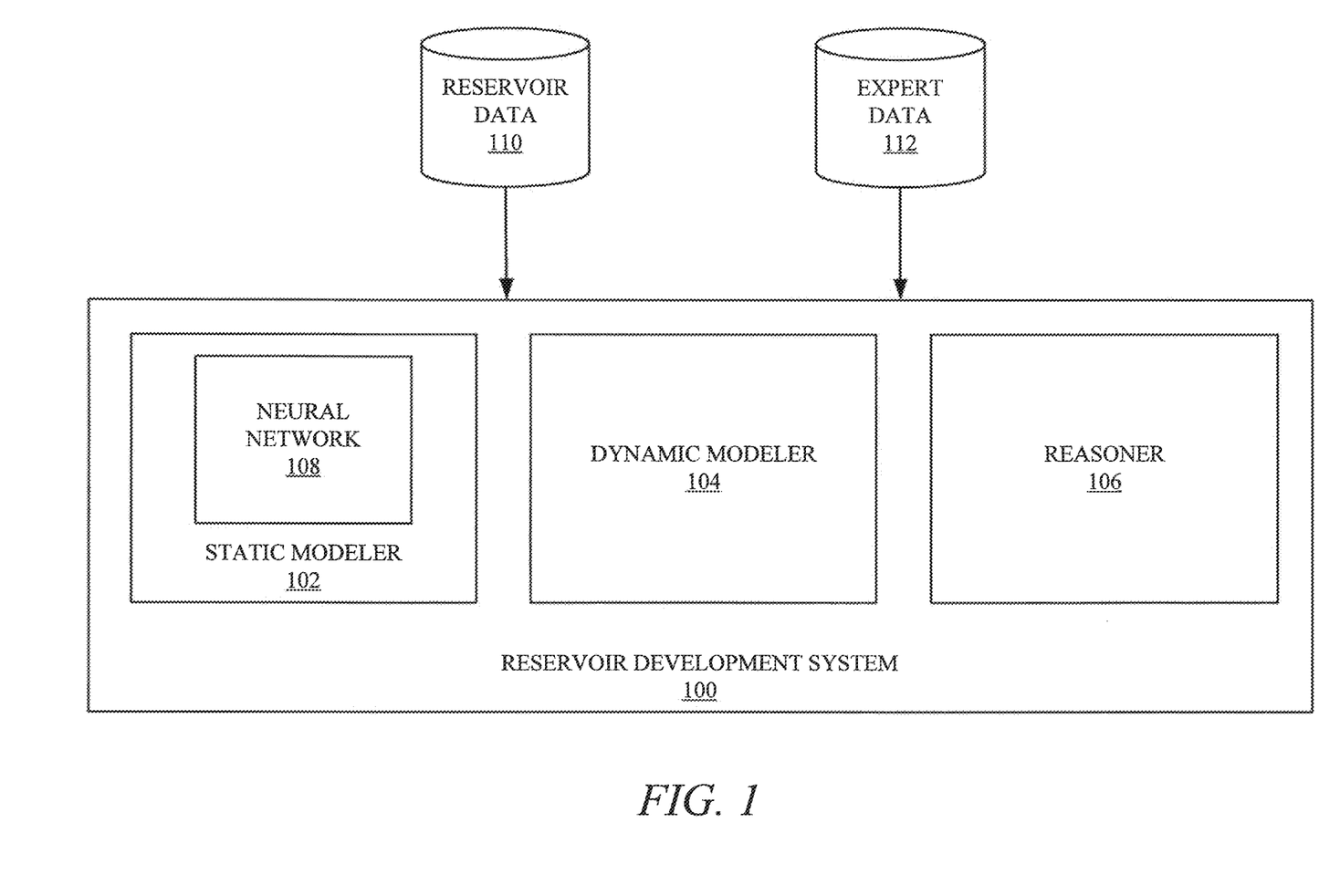
FIG. 1 illustrates an example reservoir development system including a static modeler, a dynamic modeler, and a reasoner.

To begin a detailed description of an example reservoir development system 100, reference is made to FIG. 1. In one implementation, the reservoir development system 100 incorporates data into an integrated model of a probable, true state of a reservoir and provides an assessment of one or more target regions of the reservoir having a high probability of production. The reservoir development system 100 expedites multi-disciplinary collaboration in an integrated platform. More particularly, the reservoir development system 100 integrates multi-physics data, diverse-expertise input and policies. Using various machine learning techniques, the reservoir development system 100 quantifies uncertainty and provides an automatic configuration and reconfiguration of plumbing of the reservoir. The reservoir development system 100 generates a model of the reservoir and reduces the model and underlying data to symptoms for one or more target regions of the reservoir. A ranking of these target regions is output by the reservoir development system 100 to a user device for interaction by a user via a user interface. An explanation of the rankings and decisions made during the process forming the basis of the rankings may be provided via the user interface. Overall, the reservoir development system 100 provides an expedited testing and analysis of hypotheses to identify target regions.

In one implementation, the reservoir development system 100 includes a static modeler 102, a dynamic modeler 104, and a reasoner 106. The static modeler 102 generates a static model of the reservoir using a neural network 108 while quantifying uncertainty. In one implementation, the static modeler 102 uses the neural network 108 to generate log data in a 3D volume. A clustering algorithm, such as a k-means clustering algorithm, is learned and applied to divide the 3D volume into clusters. The static modeler 102 uses a k-nearest neighbor algorithm to generate 3D values, such as permeability, porosity, and saturation by regression over log attributes. The dynamic modeler 104 generates a dynamic model of the reservoir using the static model and dynamic data, such as pressure. Based on the dynamic model, the reasoner 106 generates a ranking of target regions for drilling with supporting information in relative and absolute terms detailing how the ranking was produced.

The reservoir development system 100 receives and digests data from one or more sources. In one implementation, the data includes reservoir data 110 captured using one or more measuring tools deployed at a reservoir and expert data 112 including reservoir data having one or more attributes expertly labeled by a professional. Any changes to the expert labels of the same attribute may be retained and stored in a database for subsequent access and analysis.

In one implementation, the reservoir data 110 includes, without limitation, field data and well data. The field data may include four-dimensional (4D) seismic data, which incorporates a plurality of time-lapsed three-dimensional (3D) subsurface images portraying changes in the reservoir over time. The well data includes various information captured about one or more wells at the reservoir and may include, without limitation, well name, well trajectories, well logs, core data, completions, production, pressure, and/or the like. Each of the well trajectories is a path along which a well is drilled at the reservoir. Well logs are a concise, detailed plot of formation parameters versus depth that are captured using logging tools deployed along the well trajectory. The well logs may include gamma ray (GR), neutron porosity sandstone matrix (NPSS), bulk density (RhoB), deep resistivity (RDEEP), and/or the like. The core data, such as permeability and water saturation, are typically obtained by conducting laboratory experiments on core samples extracted long the well trajectory. The completions may include perforation intervals, and the production may include oil production, gas production, and/or water production. The pressure may include buildup.

The expert data 112 may include, without limitation, expertly labeled seismic data, expertly labeled well logs, OWCS, and/or the like. The expertly labeled seismic data may include fault data and/or surface data, and the expertly labeled well logs may include permeability, porosity, and/or the like. The expert data 112 may include the same data labeled by a plurality of experts with commonalities and differences of attributes labeled by the experts tracked and stored.

In one implementation, the static modeler 102 receives static data of the reservoir data 110 and the expert data 112, and utilizing a chain of supervised and unsupervised machine learning algorithms, the static modeler 102 realizes a static characterization of the reservoir while quantifying uncertainty. The static modeler 102 receives static log data, such as GR, NPSS, and/or the like, along a well trajectory. Each static log data is collected on the measured locations along the well trajectory. For each static log data, several, for example with a preassigned value N, neural networks 108 are learned by fitting feature vectors to observed log data. In each of the neural networks 108, the feature vectors vary as a result of different sets of randomly selected points. The static modeler 102 applies the learned neural networks 108 to predict log data in the 3D reservoir volume. As a result, N realizations of each static log data are obtained. For example, there may be N realizations for GR, N realizations for NPSS, and so forth to populate the log data in the 3D volume of the reservoir.

An unlabeled dataset is obtained by collecting the samples that all the log attributes are measured and available. Stated differently, if the attributes are GR, NPSS, RhoB, RDEEP, etc., then all the samples along the well trajectory with available (GR, NPSS, RhoB, RDEEP, etc.) are collected. The static modeler 102 then learns a clustering model by fitting a k-means clustering algorithm to the generated unlabeled dataset. After learning the clustering model, random samples of GR, NPSS, RhoB, RDEEP, etc., are selected from the populated 3D log data. The learned k-means clustering algorithm, alongside the randomly selected 3D log data, is used by the static modeler 102 to cluster the reservoir domain.

In one implementation, a labeled dataset is obtained corresponding to each core data, including permeability, porosity, water saturation, and/or the like. The feature vectors are log attributes, such as GR, NPSS, RhoB, RDEEP, etc., and the labels are the core data. The static modeler 102 adopts a k-nearest neighbor algorithm to learn the relationship between each core data and log attributes. The learned k-nearest neighbor algorithm alongside the 3D populated log data in the reservoir volume are used by the static modeler 102 to estimate the core data in the reservoir 3D volume.

The static modeler 102 obtained M number of geo-models (herein also called static models), where each geo-model contains a random sample of populated log attributes (selected from the N realizations obtained from the neural networks 108) in the 3D reservoir domain, such as GR, NPSS, RhoB, RDEEP, etc., a clustered 3D volume, and 3D volumes of core data, including permeability, porosity, and water saturation.

Figure 2:
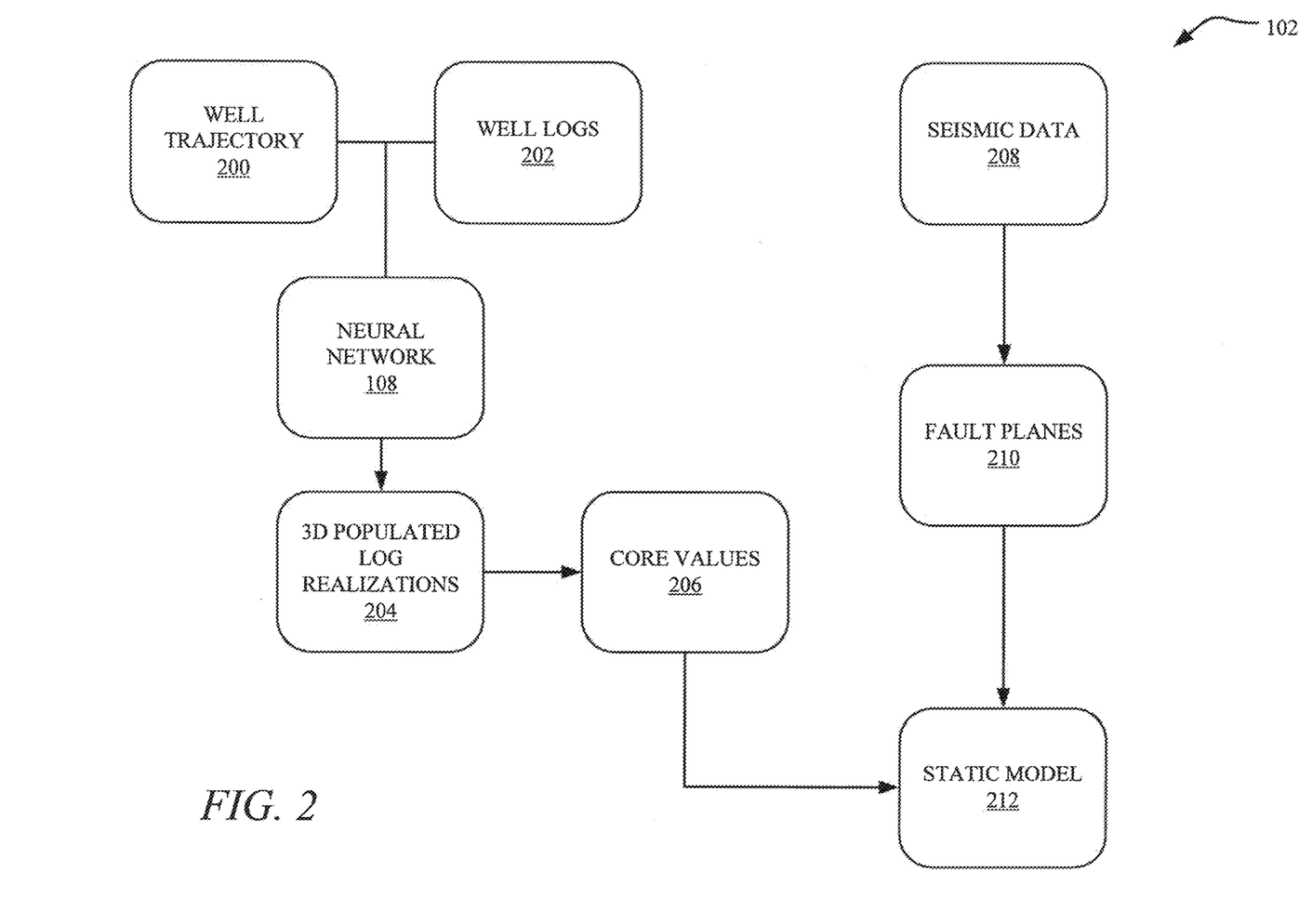
FIG. 2 illustrates an example static modeler of the reservoir development system.

As can be understood from FIGS. 1-2, the static modeler 102 receives well logs 202 along a well trajectory and well trajectory data 200, including a set of observed data points (with x, y, and z coordinates for each measurement) in a volume along the well trajectory. Using the well logs 202 and the well trajectory data 200, the neural network 108 of the static modeler 102 generates 3D populated logs across a volume of the reservoir.

Uncertainty increases with distance away from the well trajectory where volumetric density of information is lower. As such, the static modeler 102 quantifies uncertainty using a 3D populated log, resulted by the neural networks 108. In one implementation, the static modeler 102 generates n random points in 3D space. For each of the observed data points in the well trajectory data 200, the static modeler 102 generates a set of feature vectors based on a distance between the observed data point and each of the random points. Each feature vector includes corresponding log values from the well logs 202. For each configuration of random points, one of the neural networks 108 is trained with the feature vectors, and it propagates the values across the volume of the reservoir to generate a 3D populated log. The source of the uncertainty is the n random points. To address this uncertainty, the static modeler 102 changes the random points, which changes the training data for the neural network 108 and thus the 3D populated log generated by the neural network 108. As such, the neural network 108 generates a plurality of 3D populated log realizations 204 that are each different and equally probable.

In one implementation, the static modeler 102 generates core values 206, including permeability, porosity, initial water saturation, and/or the like, from the 3D populated log realizations 204. More particularly, the core values 206 are generated using a k-nearest neighbors algorithm. In one implementation, the static modeler 102 takes advantage of core data, including permeability, porosity, water saturation, and/or the like, along the well trajectory to build regression models, using a k-nearest neighbors algorithm, that relate log data to core data to obtain the core values 206. The input features to these regression models are log data, and the output features of the regression models are core data. After the regression models are learned, the regression models are applied on the 3D log data in the reservoir domain to populate the core data in the 3D reservoir volume as the core values 206. The k-nearest neighbors algorithm is thus performed over many instances for each of NPSS, RhoB, GR, and RDEEP. Petrophysicist assigned rock properties, including porosity and permeability, may further be utilized.

From the core values 206, the static modeler 102 generates a static model 212 of the reservoir by clustering the reservoir into one or more rock types. More particularly, each sub-region of the reservoir is assigned into one cluster. For example, if there are 20 clusters, it is an indication that there are 20 different rock types. As another example, if the reservoir is divided into 2000 sub-regions, then each region is assigned a label in the range 1, 2, 3, . . . , 20. Therefore, there may exist several sub-regions of the reservoir with one label (e.g., label 5), which indicates the regions with almost similar rock type (e.g., regions having a rock type with an index 5). In one implementation, the static model 212 is generated through k-means clustering, which partitions n observations into k clusters in which each observation belongs to the cluster with the nearest mean. The clusters of the static model 212 obtained through the k-means clustering includes NPSS, RhoB, GR, and RDEEP values at each voxel of the 3D representation.

In one implementation, the static modeler 102 receives seismic data 208, which may be expertly labeled and include surfaces of one or more layers of the reservoir (e.g., three different layers) and fault data, including fault polygons. From the seismic data 208, the static modeler 102 generates fault planes 210 through 3D plane fitting to add faults to the clusters of the static model 212.

As described above, the static model 212 is thus a static characterization of the reservoir that quantifies uncertainty. The dynamic modeler 104 receives the static model 212 from the static modeler 102 and time dependent data for the reservoir. Generally, the dynamic modeler 104 utilizes semi-supervised artificial intelligence to build higher order connectivity relationships among static regions according to applied physics. Stated differently, the dynamic modeler 104 represents the static model 212 as a graph and enables integration of different data-driven attributes as well as fundamental physics of flow in porous media through the obtained graph.

In one implementation, the dynamic modeler 104 receives clusters of rock types from the static model 212 and constructs a reservoir graph representing the clusters as graph vertices. The vertex properties of graph representation of the static model 212 includes location (x, y, z), porosity, pore volume, permeability, and initial oil saturation. Each vertex is defined to contain a spatially continuous voxel set. The dynamic model 104 defines graph connectivity through nodal connectivity of neighboring clusters. The graph may be updated automatically with new fault planes, which act as nodes with zero or reduced permeability. The faults change the connectivity across the domain. Low confidence faults that are identified a number of times below a threshold may be removed. The dynamic modeler 104 transforms the static model 212 into nodes including fault effects and defines the connectivity.

In one implementation, the dynamic modeler 104 estimates pressure using the connectivity. The nodes with high connectivity are more likely to have similar pressures. Continuity in reservoir fluids allows for propagating pressure from observation points across the 3D network. The areas with no connectivity to the observation points are considered uncertain in pressure values. As such, when a new pressure point becomes available, the dynamic modeler 104 propagates the new pressure point across the volume, as it might represent an isolated section of the reservoir. The dynamic modeler 104 utilizes the connectivity in the 3D structure to propagate pressure observations. The dynamic modeler 104 receives 4D seismic data from which the dynamic modeler 104 determines fluid saturation across the reservoir. From the static model 212, the pressure, and the fluid saturation, the dynamic modeler 104 generates a dynamic model of the reservoir.

The dynamic model may be augmented with additional data sources and updated over time, for example, as the pressure and/or the saturation changes. Further, modular properties may be ascribed to the dynamic model for interpretation by the reasoner 106. The static modeler 102 and the dynamic modeler 104 reduce integration time between static and dynamic data, facilitate assimilation of pressure and saturation observations, and expedite construction of 3D plumbing of the reservoir. The reasoner 106 utilizes the reservoir model, including the static model and/or the dynamic model, to rank sub-volumes of the reservoir as potential target regions for drilling.

In one implementation, the reasoner 106 includes a fuzzy inference engine that generates a recommendation by reasoning over the underlying reservoir model and evaluating target volumes against a set of one or more rules. The fuzzy inference engine may perform one or more stages of fuzzy inference. The reasoner 106 may generate a set of one or more features computable from the static model 212 and the dynamic model. For example, the set of features may include 24 features, such as a distance to aquifer, short term connected oil volume, long term accessible energy, and/or the like. The reasoner 106 utilizes the set of rules relating the values of the set of features to a drilling attractiveness of a node. For example, if energy is high and connected water volume is low and connected oil volume is high and connected oil volume uncertainty is low, then drilling attractiveness is high. Similarly, if short term accessible energy is high and medium term accessible energy is high and long term accessible energy is high, then energy is high. As another example, if distance to aquifer is high then drilling attractiveness is high.

The recommendation generated by the reasoner 106 includes ranked volumes where potential target regions for drillings are ranked in a list. For each of the rankings, the reasoner 106 provides an audit trail detailing, in relative and/or absolute terms, how the ranking was produced. The reasoner 106 further monitors the static modeler 102 and the dynamic modeler 104 for updates, including new inputs and/or changes. If the reasoner 106 detects any updates, the reasoner 106 generates a reranking of the target regions in real time.

Stated differently, in one implementation, the reasoner 106 executes a policy of the set of rules defining desirable and undesirable volume features, and the reasoner 106 combines values for different categories hierarchically to produce an aggregate score for each of the volumes. The ranked volumes includes each of the target regions ranked in a list according to the aggregate scores. As such, the ranked volumes are quantitative ratings, which are output as a user interface that a user may interact with using a user device to inspect the underlying rationale of the rankings to identify target regions for drilling.

Figure 3A:
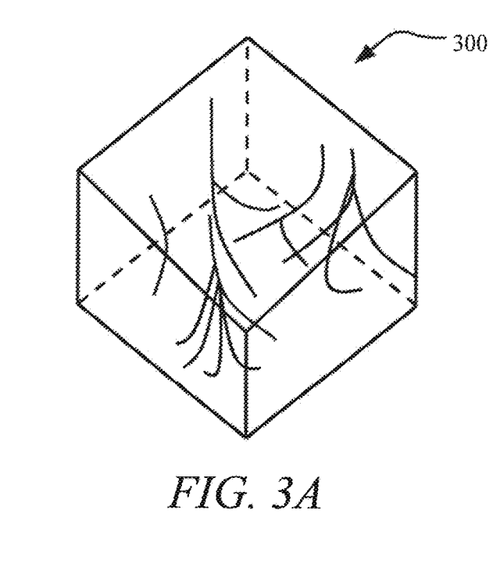
FIG. 3A depicts example well trajectories in three-dimensional space.
Figure 3B:
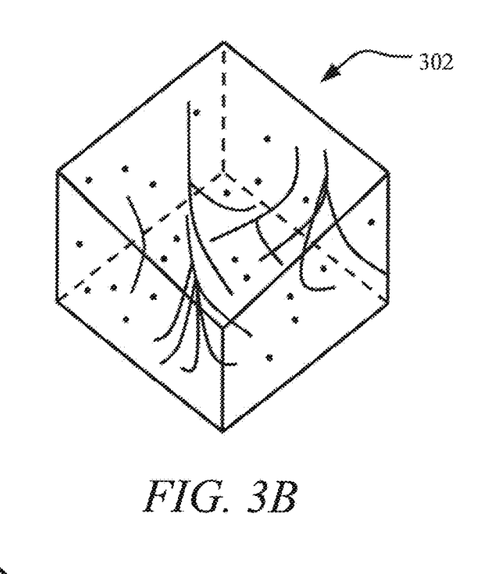
FIG. 3B shows random points generated in the three-dimensional space.
Figure 3C:
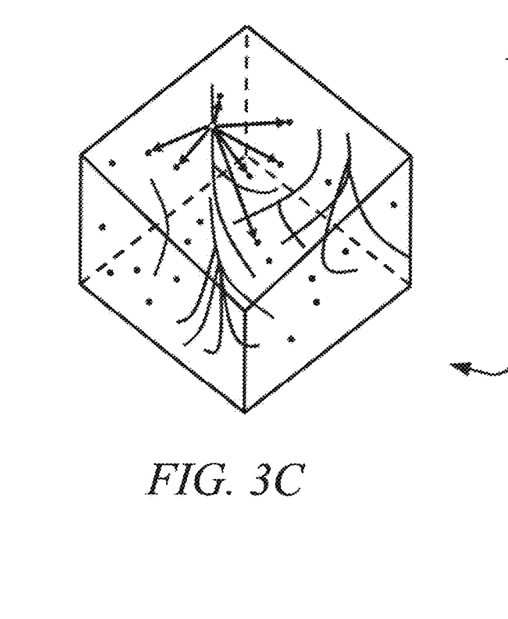
FIG. 3C illustrates features vectors defined in the three-dimensional space.

As described herein, the static modeler 102 generates a neural network based population of static data with learned features as inputs and a specific type of static data, such as gamma ray, output in the static model 212. Turning to FIGS. 3A-3C, input features into the neural network 108 are illustrated. In one implementation, a first representation 300 of a 3D volume of space, which includes one or more well trajectories having a set of one or more observed data points, is obtained by the static modeler 102. The static modeler 102 generates n random points in the 3D volume of space to obtain a second representation 302. In one implementation, the static modeler 102 calculates the Euclidean distance from each of the n random points for each observed data point at well locations to obtain input feature vectors, illustrated in a third representation 304.

In one implementation, for each of the observed data points, the input for the neural network 108 is defined by the feature vectors. More particularly, for each observed data point, input=[distance 1, distance 2, distance 3, . . . , distance n]. Using the feature vectors, the neural network 108 is trained for each of the well log properties. For example for gamma ray, the training data for the neural network 108 may be defined as: {(input 1, GR 1), (input 2, GR 2), (input 3, GR 3), . . . , (input n, GR n)}. Once the neural network 108 is trained, the neural network 108 generates the same length-n feature vectors for every location in the 3D volume of space. Stated differently, for every location in the 3D volume of space, input=[distance 1, distance 2, distance 3, . . . , distance n]. Using this input, the trained neural network 108 predicts the value of the static log data to populate the static log data for the entire field, thereby obtaining 3D populated logs. In another implementation, distance i is replaced by difference vector i=(delta x, delta y, delta z)_i, where delta x, for example, is defined as x(data)−x(random point)_i. Thus, in this implementation, the feature vector becomes input=[difference vector 1, difference vector 2, difference vector 3, . . . , difference vector n].

Figure 4:
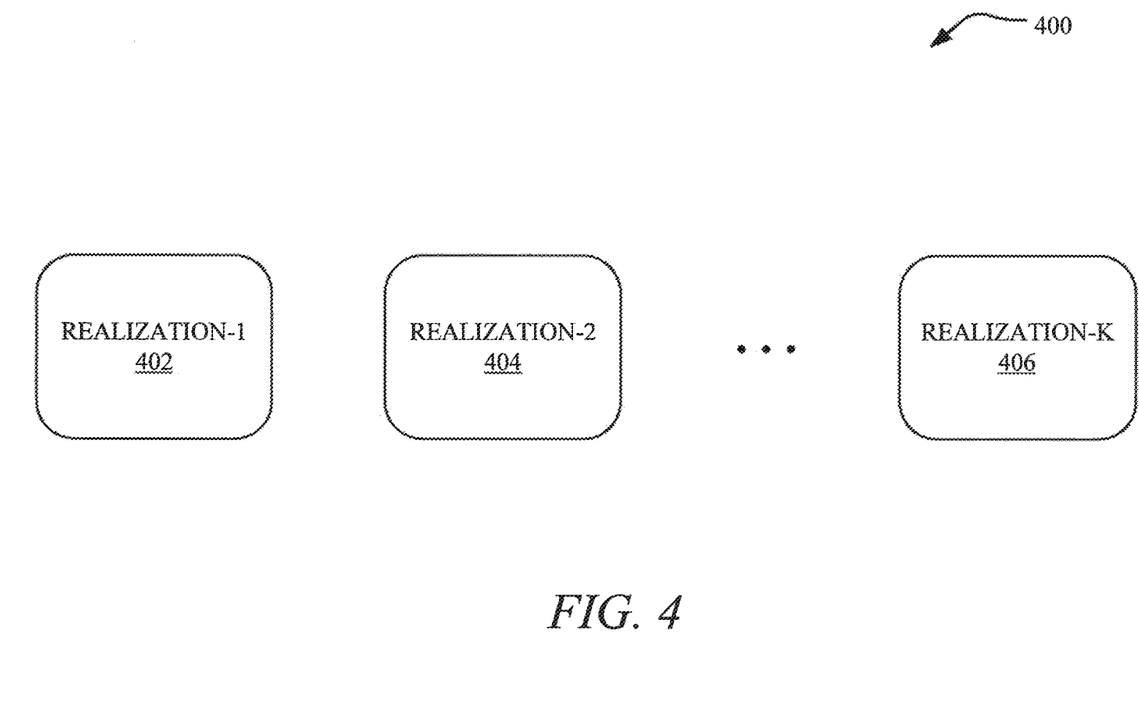
FIG. 4 shows a plurality of realizations of three-dimensional populated logs.

The source of uncertainty in the 3D populated logs is the n random points, such that changing the random points results in different training data for the neural network 108. In one implementation, the neural network 108 is capable of matching the training data outputs. Turning to FIG. 4, to quantify uncertainty, the neural network 108 generates a realization set 400 of a plurality of K realizations 402-406 of the 3D populated logs. Each of the realizations 402-406 is different and equally probable. Random realizations of the different log data, such as GR, NPSS, and/or the like, are selected and the learned k-means regression is applied on the selected realizations of the realization set 400 to generate core values, such as porosity, permeability, and water saturation in the 3D reservoir volume.

Figure 5A:
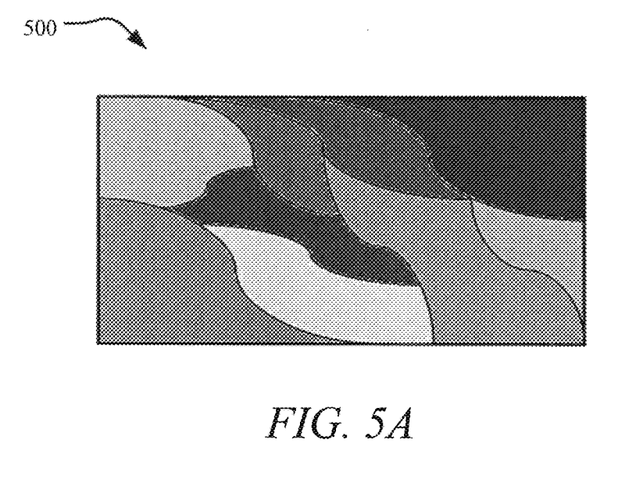
FIG. 5A illustrates a static model of a reservoir having a plurality of clusters.
Figure 5B:
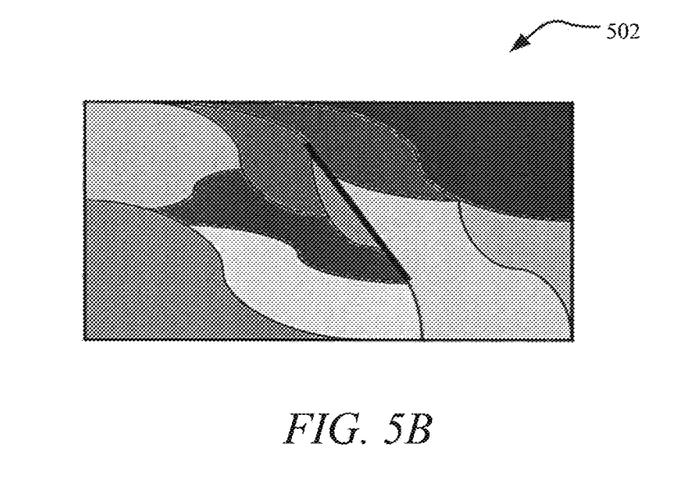
FIG. 5B depicts a fault imposed on the static model.

Using these values, the static modeler 102 generates a static model 500 having a plurality of clusters of rock types, as shown in FIG. 5A. To add a fault to a cluster of the static model, a fault plane is imposed on the matrix of clusters, which results in further division of the clusters. The fault, as shown in updated static model 502 in FIG. 5B, redefines the boundaries in the system.

Figure 5C:
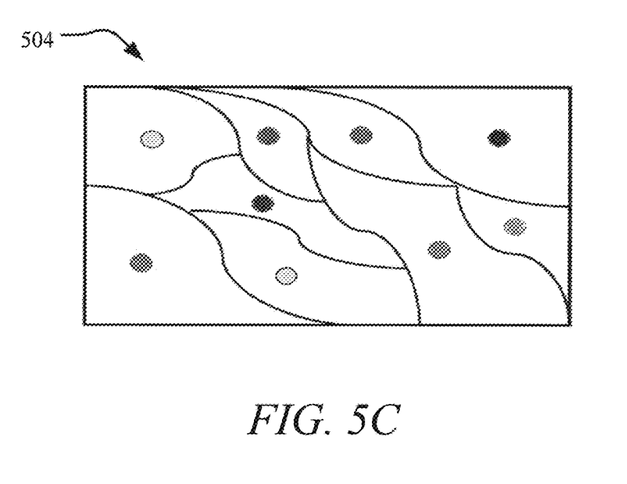
FIG. 5C shows the static model defined as a graph.

Turning to FIG. 5C, in one implementation, a reservoir graph 504 is defined from the static model 500. More particularly, the reservoir R is defined as graph $G_R$:

$$G_R=(V,E), \text{ where } V=\{v_1, v_2, \ldots, v_j, \ldots, v_n\} \text{ and } E=\{\ldots,(v_i,v_j),\ldots\}$$

V is thus the set of vertices and E is the set of edges for the graph. The vertex $v_i$ is the centroid of cluster i. For each of the realizations 402-406 of the static model 500, the reservoir graph 504 may be constructed. In one implementation, the raw static cluster outputs of the reservoir model 500 are further divided in constructing the reservoir graph 504, such that: each cluster has at most one pressure observation point; only one well passes through the cluster; and each cluster contains a spatially continuous voxel set only. With respect to the spatially continuous voxel set, a post-processing on the clusters may break discontinuous clusters into blobs. Further, a smoothing algorithm may be applied to dissolve very small clusters in the reservoir graph 504.

Figure 5D:
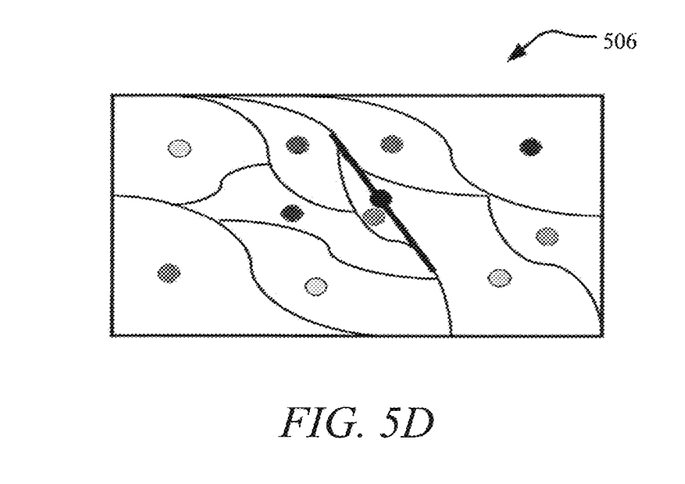
FIG. 5D illustrates the graph with points of the fault collapsed into a vertex.

Turning to FIG. 5D, as described herein, to add a fault to a cluster, a fault plane is imposed on the matrix of clusters, resulting in further division of the clusters. The fault, as shown in reservoir graph 506, redefines the boundaries of the system. In one implementation, the points of a fault as collapsed into a vertex. For example, the vertex $v_i$ has properties, including, but not limited to, location, porosity, pore volume, permeability, initial oil saturation, passing well name, fault, and/or the like.

The location $(x_i, y_i, z_i)$ is a center of mass for a set of connected voxels in the cluster i. The porosity $\varphi_i$ is an average porosity for voxels in the cluster i, and pore volume is $PV_{vi} \cdot \Sigma_{vi}^N V_n \varphi_n$, where N is a number of voxels in the cluster i and $V_n$ and $\varphi_n$ respectively, are a volume and a porosity of voxel n in the cluster i.

The permeability $K_i$ is an average permeability of the cluster i. In one implementation, since the clusters and permeability are defined using log values, it is assumed the permeability is continuous in the cluster i. Stated differently, there should be no flow barrier (high permeability contrast) with the cluster itself, and permeability anisotropy is minimal. As such, directional permeability may be disregarded. In another implementation, the clusters are analyzed to ensure there is no flow barrier, however narrow, that can block an entire cross section in a given direction. Heterogeneity in permeability may be tolerated where it is dispersed in the space, and to account for this, directional permeability may be calculated for each of the clusters using a flow simulation or approximation. Similarly, the initial oil saturation $S_{oi}$ is an average initial saturation for voxels in the cluster i. A continuity for the initial oil saturation may be assured similar to the permeability.

In one implementation, the passing well name is the name of the well passing through the cluster i. With respect to fault, if the vertex represents a fault, the value is true. Otherwise, the value is false. In one implementation, if the vertex is a fault, its permeability is zero. In another implementation, if the vertex is a fault, the permeability may be manually or otherwise automatically specified based on the reservoir data 110 and/or the expert data 112. The edges may be detected and weighted for the reservoir graphs 504 and/or 506.

As such, the reservoir graphs 504 and/or 506 may have various nodal properties, graph traversal attributes, and/or the like. For example, the nodal properties may include, without limitation, vertex, vertex location, porosity, pore volume, permeability, vertex height, water saturation, static uncertainty, list perforations, fault, fault confidence, shale, aquifer, adjacent vertices, edge weights, time distance, boundary central voxel, shared area neighbors, pressure, and/or the like. The graph traversal attributes may include, without limitation, sorted path index, sorted path time, distance to aquifer, transmissibility, short term connected oil volume, cumulative production of short term interfering wells, short term accessible energy, short term connected water volume, short term connected oil volume uncertainty, medium term connected oil volume, cumulative productions of medium term interfering wells, medium term accessible energy, medium term connected water volume, medium term connected oil volume uncertainty, long term connected oil volume, cumulative production of long term interfering wells, long term accessible energy, long term connected water volume, long term connected oil volume uncertainty, number of nearby faults, average connectivity of nearby faults, average confidence of nearby faults, number of midway faults, average connectivity of midway faults, average confidence of midway faults, number of distant faults, average connectivity of distant faults, average confidence of distant faults, and/or the like. The reasoner 106 may utilize these attributes in generating the ranked volumes.

Figure 6:
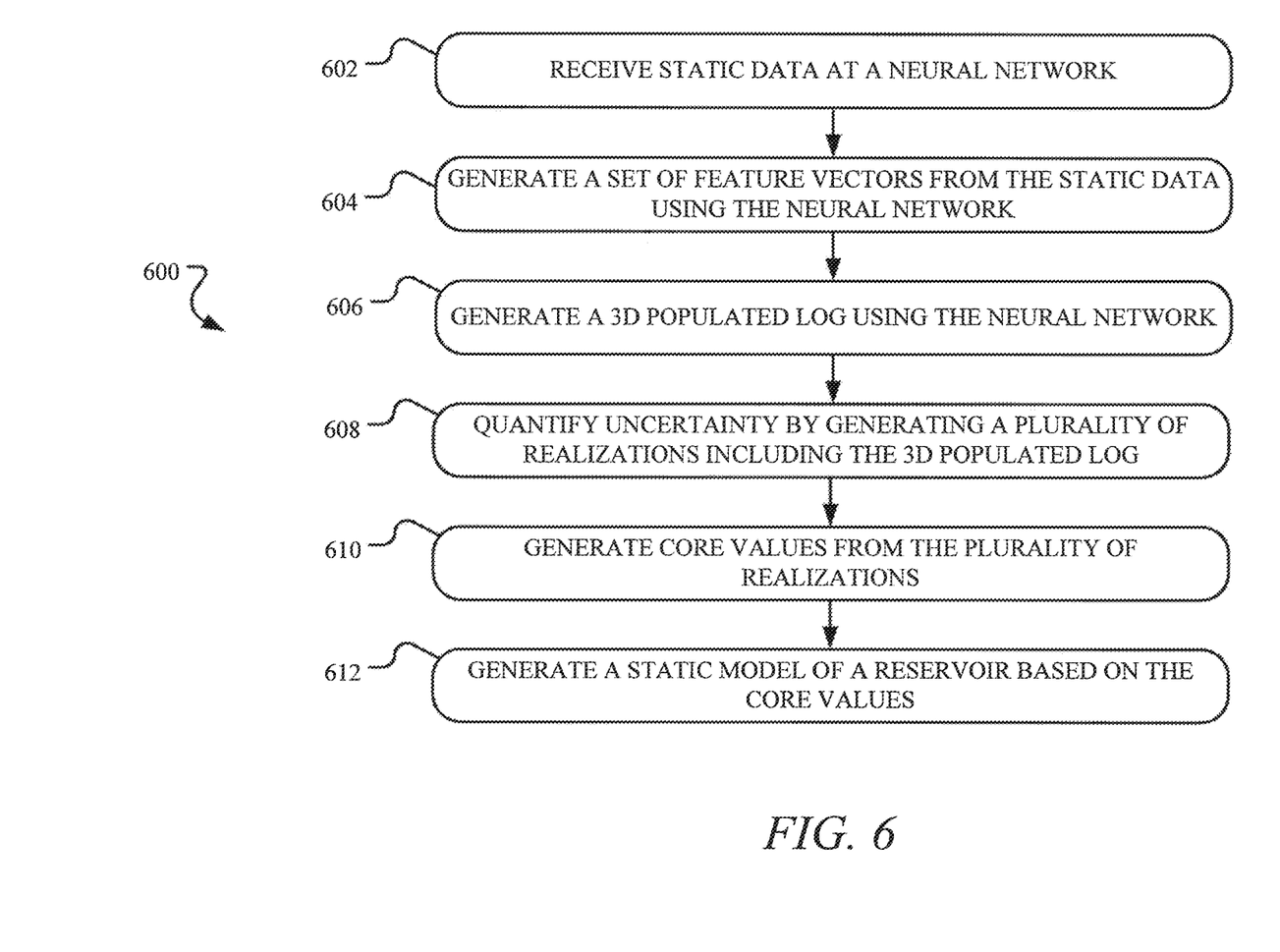
FIG. 6 illustrates example operations for reservoir development.

Referring to FIG. 6, example operations 600 for reservoir development are illustrated. In one implementation, an operation 602 receives static data at a neural network. The static data includes a set of observed data points in a volume along a well trajectory and well logs corresponding to the set of observed data points. An operation 604 generates a set of feature vectors to feed the neural network. The set of feature vectors defined based on a distance between each of the observed data points and a set of randomly generated points in the volume. An operation 606 generates a 3D populated log using the neural network by propagating well log values of the set of feature vectors across the volume. An operation 608 quantifies uncertainty by generating a plurality of realizations including the 3D populated log using the neural network, with each of the plurality of realizations being different and equally probable. An operation 610 generates core values from the plurality of realizations, and an operation 612 generates a static model of the reservoir by clustering the volume into one or more rock types based on the log values.

Figure 7:
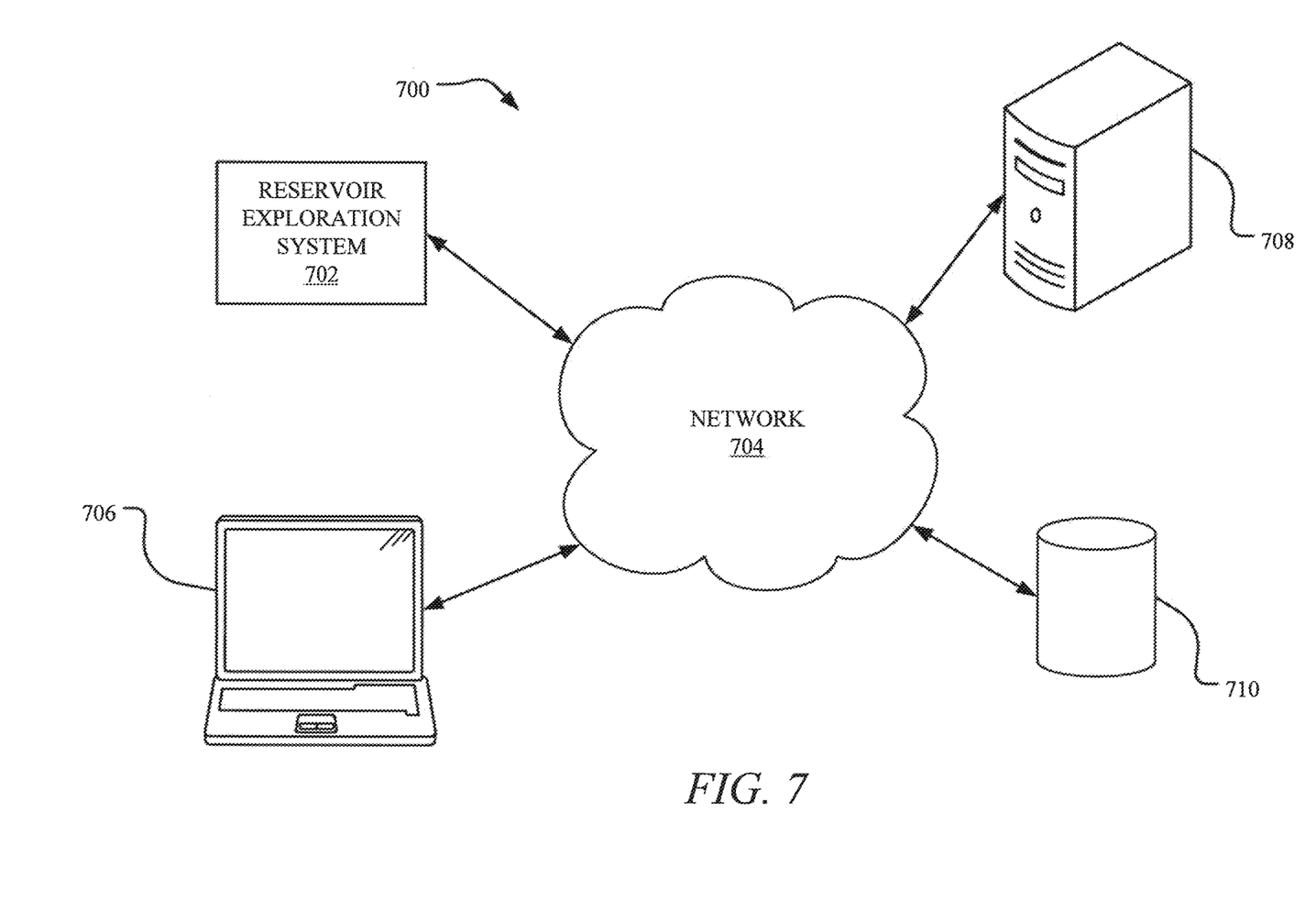
FIG. 7 shows an example network environment that may implement various systems and methods discussed herein.

For a detailed description of an example network environment 700 for reservoir development, reference is made to FIG. 7. In one implementation, a user, such as a member of the interprofessional team, accesses and interacts with a reservoir development system 702 using a user device 706 to access, generate, or otherwise interact with reservoir models, recommendations, underlying data, and/or other information via a network 704. The reservoir development system 702 may incorporate some or all or some of the features of the reservoir development system 100 described herein.

The user device 706 is generally any form of computing device capable of interacting with the network 704, such as a personal computer, terminal, workstation, desktop computer, portable computer, mobile device, smartphone, tablet, multimedia console, etc. The network 704 is used by one or more computing or data storage devices (e.g., one or more databases 710 or other computing units described herein) for implementing the reservoir development system 702 and other services, applications, or modules in the network environment 700. The reservoir data, the expert data, rules, features, reservoir models, recommendations, software, and other information utilized by the reservoir development system 702 may be stored in and accessed from the one or more databases 710.

In one implementation, the network environment 700 includes at least one server 708 hosting a website or an application that the user may visit to access the reservoir development system 702 and/or other network components. The server 708 may be a single server, a plurality of servers with each such server being a physical server or a virtual machine, or a collection of both physical servers and virtual machines. In another implementation, a cloud hosts one or more components of the network environment 700. The user devices 706, the server 708, and other resources connected to the network 704 may access one or more other servers to access to one or more websites, applications, web services interfaces, storage devices, computing devices, or the like that are used for reservoir characterization, exploration, development, and production. The server 708 may also host a search engine that the reservoir development system 702 uses for accessing, searching for, and modifying reservoir models, recommendations, underlying data, and other data, as well as for providing reservoir characterization, exploration, development, and production services, as described herein.

Figure 8:
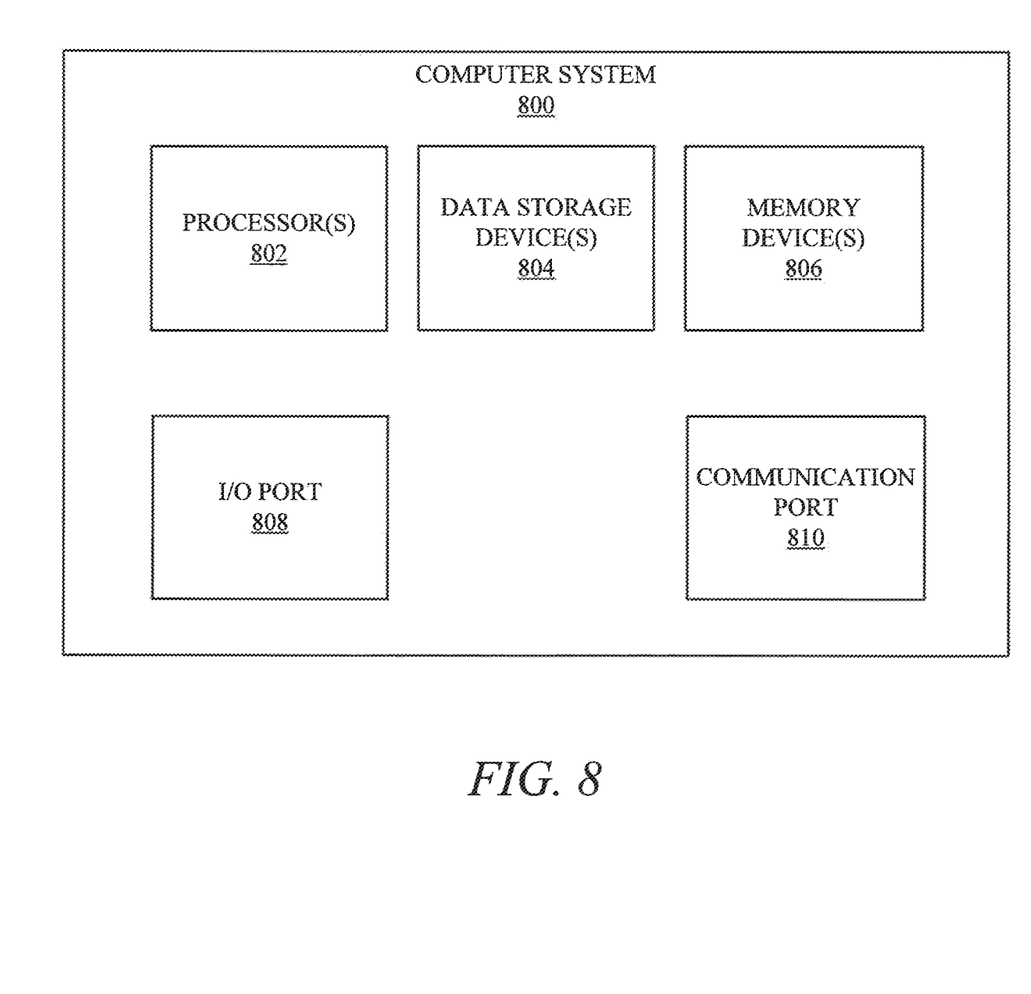
FIG. 8 is an example computing system that may implement various systems and methods discussed herein.

Referring to FIG. 8, a detailed description of an example computing system 800 having one or more computing units that may implement various systems and methods discussed herein is provided. The computing system 800 may be applicable to the reservoir development system 100, the static modeler 102, the dynamic modeler 104, the reasoner 106, the user devices 706, the reservoir development system 702, and other computing or network devices. It will be appreciated that specific implementations of these devices may be of differing possible specific computing architectures not all of which are specifically discussed herein but will be understood by those of ordinary skill in the art.

The computer system 800 may be a computing system is capable of executing a computer program product to execute a computer process. Data and program files may be input to the computer system 800, which reads the files and executes the programs therein. Some of the elements of the computer system 800 are shown in FIG. 8, including one or more hardware processors 802, one or more data storage devices 804, one or more memory devices 808, and/or one or more ports 808-810. Additionally, other elements that will be recognized by those skilled in the art may be included in the computing system 800 but are not explicitly depicted in FIG. 8 or discussed further herein. Various elements of the computer system 800 may communicate with one another by way of one or more communication buses, point-to-point communication paths, or other communication means not explicitly depicted in FIG. 8.

The processor 802 may include, for example, a central processing unit (CPU), a microprocessor, a microcontroller, a digital signal processor (DSP), and/or one or more internal levels of cache. There may be one or more processors 802, such that the processor 802 comprises a single central-processing unit, or a plurality of processing units capable of executing instructions and performing operations in parallel with each other, commonly referred to as a parallel processing environment.

The computer system 800 may be a conventional computer, a distributed computer, or any other type of computer, such as one or more external computers made available via a cloud computing architecture. The presently described technology is optionally implemented in software stored on the data stored device(s) 804, stored on the memory device(s) 806, and/or communicated via one or more of the ports 808-810, thereby transforming the computer system 800 in FIG. 8 to a special purpose machine for implementing the operations described herein. Examples of the computer system 800 include personal computers, terminals, workstations, mobile phones, tablets, laptops, personal computers, multimedia consoles, gaming consoles, set top boxes, and the like.

The one or more data storage devices 804 may include any non-volatile data storage device capable of storing data generated or employed within the computing system 800, such as computer executable instructions for performing a computer process, which may include instructions of both application programs and an operating system (OS) that manages the various components of the computing system 800. The data storage devices 804 may include, without limitation, magnetic disk drives, optical disk drives, solid state drives (SSDs), flash drives, and the like. The data storage devices 804 may include removable data storage media, non-removable data storage media, and/or external storage devices made available via a wired or wireless network architecture with such computer program products, including one or more database management products, web server products, application server products, and/or other additional software components. Examples of removable data storage media include Compact Disc Read-Only Memory (CD-ROM), Digital Versatile Disc Read-Only Memory (DVD-ROM), magneto-optical disks, flash drives, and the like. Examples of non-removable data storage media include internal magnetic hard disks, SSDs, and the like. The one or more memory devices 806 may include volatile memory (e.g., dynamic random access memory (DRAM), static random access memory (SRAM), etc.) and/or non-volatile memory (e.g., read-only memory (ROM), flash memory, etc.).

Computer program products containing mechanisms to effectuate the systems and methods in accordance with the presently described technology may reside in the data storage devices 804 and/or the memory devices 806, which may be referred to as machine-readable media. It will be appreciated that machine-readable media may include any tangible non-transitory medium that is capable of storing or encoding instructions to perform any one or more of the operations of the present disclosure for execution by a machine or that is capable of storing or encoding data structures and/or modules utilized by or associated with such instructions. Machine-readable media may include a single medium or multiple media (e.g., a centralized or distributed database, and/or associated caches and servers) that store the one or more executable instructions or data structures.

In some implementations, the computer system 800 includes one or more ports, such as an input/output (I/O) port 808 and a communication port 810, for communicating with other computing, network, or vehicle devices. It will be appreciated that the ports 808-810 may be combined or separate and that more or fewer ports may be included in the computer system 800.

The I/O port 808 may be connected to an I/O device, or other device, by which information is input to or output from the computing system 800. Such I/O devices may include, without limitation, one or more input devices, output devices, and/or environment transducer devices.

In one implementation, the input devices convert a human-generated signal, such as, human voice, physical movement, physical touch or pressure, and/or the like, into electrical signals as input data into the computing system 800 via the I/O port 808. Similarly, the output devices may convert electrical signals received from computing system 800 via the I/O port 808 into signals that may be sensed as output by a human, such as sound, light, and/or touch. The input device may be an alphanumeric input device, including alphanumeric and other keys for communicating information and/or command selections to the processor 802 via the I/O port 808. The input device may be another type of user input device including, but not limited to: direction and selection control devices, such as a mouse, a trackball, cursor direction keys, a joystick, and/or a wheel; one or more sensors, such as a camera, a microphone, a positional sensor, an orientation sensor, a gravitational sensor, an inertial sensor, and/or an accelerometer; and/or a touch-sensitive display screen ("touchscreen"). The output devices may include, without limitation, a display, a touchscreen, a speaker, a tactile and/or haptic output device, and/or the like. In some implementations, the input device and the output device may be the same device, for example, in the case of a touchscreen.

The environment transducer devices convert one form of energy or signal into another for input into or output from the computing system 800 via the I/O port 808. For example, an electrical signal generated within the computing system 800 may be converted to another type of signal, and/or vice-versa. In one implementation, the environment transducer devices sense characteristics or aspects of an environment local to or remote from the computing device 800, such as, light, sound, temperature, pressure, magnetic field, electric field, chemical properties, physical movement, orientation, acceleration, gravity, and/or the like. Further, the environment transducer devices may generate signals to impose some effect on the environment either local to or remote from the example computing device 800, such as, physical movement of some object (e.g., a mechanical actuator), heating or cooling of a substance, adding a chemical substance, and/or the like.

In one implementation, a communication port 810 is connected to a network by way of which the computer system 800 may receive network data useful in executing the methods and systems set out herein as well as transmitting information and network configuration changes determined thereby. Stated differently, the communication port 810 connects the computer system 800 to one or more communication interface devices configured to transmit and/or receive information between the computing system 800 and other devices by way of one or more wired or wireless communication networks or connections. Examples of such networks or connections include, without limitation, Universal Serial Bus (USB), Ethernet, Wi-Fi, Bluetooth®, Near Field Communication (NFC), Long-Term Evolution (LTE), and so on. One or more such communication interface devices may be utilized via the communication port 810 to communicate one or more other machines, either directly over a point-to-point communication path, over a wide area network (WAN) (e.g., the Internet), over a local area network (LAN), over a cellular (e.g., third generation (3G) or fourth generation (4G)) network, or over another communication means. Further, the communication port 810 may communicate with an antenna or other link for electromagnetic signal transmission and/or reception.

In an example implementation, reservoir data, expert data, rules, features, reservoir models, recommendations, audit trails, software and other modules and services may be embodied by instructions stored on the data storage devices 804 and/or the memory devices 806 and executed by the processor 802.

The system set forth in FIG. 8 is but one possible example of a computer system that may employ or be configured in accordance with aspects of the present disclosure. It will be appreciated that other non-transitory tangible computer-readable storage media storing computer-executable instructions for implementing the presently disclosed technology on a computing system may be utilized.

In the present disclosure, the methods disclosed may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided as a computer program product, or software, that may include a non-transitory machine-readable medium having stored thereon instructions, which may be used to program a computer system (or other electronic devices) to perform a process according to the present disclosure. A machine-readable medium includes any mechanism for storing information in a form (e.g., software, processing application) readable by a machine (e.g., a computer). The machine-readable medium may include, but is not limited to, magnetic storage medium, optical storage medium; magneto-optical storage medium, read only memory (ROM); random access memory (RAM); erasable programmable memory (e.g., EPROM and EEPROM); flash memory; or other types of medium suitable for storing electronic instructions.

While the present disclosure has been described with reference to various implementations, it will be understood that these implementations are illustrative and that the scope of the present disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A method for developing a reservoir, the method comprising:
    receiving static data at a static modeler, the static data including a set of observed data points in a reservoir volume along a well trajectory and well logs corresponding to the set of observed data points;
    generating a set of feature vectors to learn neural networks, the set of feature vectors defined based on a distance between each of the observed data points and a set of randomly selected points in the reservoir volume;
    generating a three-dimensional populated log by propagating well log values of the set of feature vectors across the reservoir volume;
    quantifying uncertainty by applying the learned neural networks to generate a plurality of realizations including the three-dimensional populated log, wherein the set of randomly selected points is changed by the static modeler such that each of the plurality of realizations is different and equally probable;

clustering the reservoir volume into a plurality of clustered three-dimensional volumes using a learned clustering algorithm alongside randomly selected three-dimensional log data from the plurality of realizations;
populating core data in the reservoir volume using a learned k-nearest neighbor algorithm alongside the three-dimensional populated log; and
generating a plurality of static models, each of the static models comprising a random sample of three-dimensional populated log data of the plurality of realizations, one of the clustered three-dimensional volumes, and a three-dimensional volume of the core data.

2. The method of claim 1, wherein the core data includes at least one of porosity, permeability, or water saturation.

3. The method of claim 1, wherein the three-dimensional populated log data includes at least one of gamma ray, neutron porosity, bulk density, or resistivity.

4. The method of claim 1, wherein the learned clustering algorithm is learned k-means clustering.

5. The method of claim 1, wherein at least one of the static models includes one or more fault planes fitted to the plurality of clustered three-dimensional volumes.

6. The method of claim 1, wherein a reservoir graph is constructed from each of the static models with each of the plurality of clustered three-dimensional volumes represented as a vertex.

7. The method of claim 6, wherein the reservoir graph is defined such that each of the clustered three-dimensional volumes has at least one of: at most one pressure observation point; only one well passing through the cluster; or a spatially continuous voxel set only.

8. One or more non-transitory tangible computer-readable storage media storing computer-executable instructions for performing a computer process on a computing system, the computer process comprising:
receiving static data including a set of observed data points in a volume along a well trajectory and well logs corresponding to the set of observed data points;
generating a set of feature vectors, the set of feature vectors defined based on a distance between each of the observed data points and a set of randomly generated points in the volume;
generating a three-dimensional populated log by propagating well log values of the set of feature vectors across the volume;
quantifying uncertainty by generating a plurality of realizations including the three-dimensional populated log, wherein the set of randomly selected points is changed at the static modeler such that each of the plurality of realizations is different and equally probable;
generating core values from the plurality of realizations; and
generating a static model of a reservoir by clustering the volume into one or more clusters of rock types based on the core values.

9. The one or more non-transitory tangible computer-readable storage media of claim 8, wherein the core values include at least one of porosity, permeability, or initial saturation.

10. The one or more non-transitory tangible computer-readable storage media of claim 8, wherein the core values are generated using a k-nearest neighbor algorithm.

11. The one or more non-transitory tangible computer-readable storage media of claim 8, wherein the one or more clusters of the static model are obtained through k-means clustering.

12. The one or more non-transitory tangible computer-readable storage media of claim 8, wherein the static model includes one or more fault planes fitted to the one or more clusters.

13. The one or more non-transitory tangible computer-readable storage media of claim 8, wherein a reservoir graph is constructed from the static model with each of the one or more clusters represented as a vertex.

14. The one or more non-transitory tangible computer-readable storage media of claim 13, wherein the reservoir graph is defined such that each of the one or more clusters has at least one of: at most one pressure observation point; only one well passing through the cluster; or a spatially continuous voxel set only.

15. A system for developing a reservoir, the system comprising:
a neural network generating a set of feature vectors defined based on a distance between each observed data point of a set of observed data points in a volume along a well trajectory and a set of randomly generated points in the volume, the set of feature vectors corresponding to well log values captured using one or more measuring tools, the neural network generating a three-dimensional populated log by propagating the well log values across the volume, the neural network quantifying uncertainty by generating a plurality of realizations including the three-dimensional populated log, wherein the set of randomly selected points is changed at the static modeler such that each of the plurality of realizations is different and equally probable; and
a static modeler in communication with the neural network, the static modeler generating a static model of the reservoir by clustering the volume into one or more clusters of rock types based on the core values generated from the plurality of realizations.

16. The system of claim 15, wherein the core values include at least one of porosity, permeability, or initial saturation.

17. The system of claim 15, wherein the core values are generated using a k-nearest neighbor algorithm.

18. The system of claim 15, wherein the one or more clusters of the static model are obtained through k-means clustering.

19. The system of claim 15, wherein the static model includes one or more fault planes fitted to the one or more clusters.

20. The system of claim 15, wherein a reservoir graph is constructed from the static model with each of the one or more clusters represented as a vertex.

* * * * *